(12) United States Patent
Yang

(10) Patent No.: US 6,365,302 B1
(45) Date of Patent: Apr. 2, 2002

(54) PATTERN FOR MEASURING FOCUS OF LIGHT EXPOSING APPARATUS AND METHOD THEREOF

(75) Inventor: Hyun Jo Yang, Choengju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/551,594

(22) Filed: Apr. 17, 2000

(30) Foreign Application Priority Data

Apr. 28, 1999 (KR) .............................. 99-15264

(51) Int. Cl.$^7$ .............................. G03F 9/00; G03C 5/00
(52) U.S. Cl. .............................. 430/5; 430/30; 430/311
(58) Field of Search ................. 430/5, 30, 311

(56) References Cited

U.S. PATENT DOCUMENTS 5,928,822 A * 7/1999 Rhyu .......................... 430/30
6,066,419 A * 5/2000 Wu et al. ..................... 430/30

* cited by examiner

Primary Examiner—Christopher G. Young
(74) Attorney, Agent, or Firm—Fleshner & Kim, LLP

(57) ABSTRACT

A pattern for measuring a focus of a light exposing apparatus and a method for measuring a focus of a light exposing apparatus using the pattern are disclosed. This pattern includes a plurality of linear patterns which are spaced-apart along the boundary of the holes wherein an overlap measuring pattern has a larger outer rectangular frame and a smaller inner rectangular, for thereby significantly enhancing a reproducibility and reliability of a measuring operation by automatically measuring a focus of a light exposing apparatus using an overlap measuring apparatus and thus decreasing time required for measuring the focus.

20 Claims, 4 Drawing Sheets

UNDER FOCUS ◄──────── BEST FOCUS ────────► OVER FOCUS

PATTERN FOR MEASURING FOCUS OF LIGHT EXPOSING APPARATUS AND METHOD THEREOF

BACKGROUND OF THE INVENTION

1. Field of the Invention

The present invention relates to a method for manufacturing a semiconductor device and more particularly, to a pattern for measuring a focus of a light exposing apparatus and a method thereof that significantly decreases time requirements and enhances reliability and reproducibility.

2. Background of the Related Art

A related art light exposing apparatus for a semiconductor device manufacturing apparatus requires a process for checking whether a focus is uniform. If the focus is not within a permissible range, a focus adjusting process is performed to obtain a uniform focus. A related art method for measuring the focus involves light-exposing a semiconductor substrate having a photoresist film formed thereon using a focus measuring pattern as a mask. A photoresist film pattern formed on an upper surface of the semiconductor substrate is then compared with the focus measuring pattern.

FIG. 1 illustrates the related art focus measuring pattern, which includes a plurality of linear holes 1 each having a narrow width. Since the linear holes 1 have narrows widths, when the focus is not within the permissible range, a linear shape is not formed as the photoresist film pattern. The linear holes 1 formed at the edge portions are removed first, and a related art microscope is then used to compare the photoresist film pattern with the above-described pattern.

FIG. 2 illustrates a top view of the related art photoresist pattern obtained when a semiconductor substrate having a photoresist film pattern on its upper surface is light-exposed using the related art focus measuring pattern illustrated in FIG. 1 as a mask, while varying a focus value between a negative value (i.e., underfocus) and a positive value (i.e., overfocus). As illustrated in FIG. 2, an optimal focus is formed as an average of the underfocus and the overfocus, wherein the pattern line is removed when checking the photoresist film pattern using a related art microscope. The optimal focus based on the average value is then calibrated to a value of 0.

However, the related art focus measuring pattern and method have various problems and disadvantages. For example, the reliability of the measuring method is low because the photoresist film pattern is checked by human eyes using the microscope, and the best focus can vary when measured by different persons. Thus, the reproducibility is decreased.

Further, the positions for measuring the foci of the light exposing apparatus may vary on a wafer. Therefore, the photoresist pattern must be checked at each corresponding position by human eyes using the related art microscope, which requires about 1 hour. In addition, to check a field curvature or astigmatism, which are characteristics of the light exposing apparatus, the focus measuring operation must be performed at about 150 positions on the wafer. Therefore, measuring field curvature and astigmatism for the wafer requires about one day.

SUMMARY OF THE INVENTION

An object of the invention is to solve at least the above problems and/or disadvantages and to provide at least the advantages described hereinafter.

Accordingly, another object of the present invention is to provide a pattern for measuring a focus of a light exposing apparatus and a method thereof that significantly enhances a reproducibility and reliability of a measuring operation by automatically measuring a focus of a light exposing apparatus using an overlap measuring apparatus and thus decreases time required for measuring the focus.

Another object of the present invention is to simplify checking characteristics related to focus control of a light exposing apparatus, including measuring field curvature and astigmatism.

Another object of the present invention is to substantially reduce a time requirement for measuring a focus.

A further object of the present invention is to eliminate a zero point adjusting calibration operation, and obviate the need for microscope inspection for determining an optimal focus value.

To achieve the above objects, there is provided a focus measuring pattern for a light exposing apparatus which includes a plurality of linear patterns which are spaced-apart by a certain distance along the boundary of the holes wherein an overlap measuring pattern has a frame-shaped larger outer rectangular and a frame-shaped smaller inner rectangular.

Also, to achieve the objects of the present invention, there is provide an alternative overlap measuring pattern for forming a photoresist pattern on a substrate, comprising an outer frame, an inner frame positioned within the outer frame wherein the inner frame and the outer frame have a rectangular shape and form a mask region that blocks the transmission of light from a light exposing apparatus, a light transmission region positioned between the inner frame and the outer frame that allows a transmission of light from the light exposing apparatus, and a focus measuring pattern positioned in the light transmission region.

Another embodiment of the present invention provides an overlap measuring pattern for forming a photoresist pattern on a substrate, comprising an outer rectangular-shaped frame having a first region and a second region, an inner rectangular-shaped frame having a third region and a fourth region, an intermediate region positioned between the outer frame and the inner frame having a fifth region and a sixth region, wherein the first region, the third region and the sixth region form a light transmission region that allows a light transmission from a light exposing apparatus, and the second region, the fourth region and the fifth region form a mask region that blocks light transmission from the light exposing apparatus, and a focus measuring pattern positioned in the light transmission region.

A further embodiment of the present invention provides an overlap measuring pattern for forming a photoresist pattern on a substrate, comprising a reference region adapted to be imaged onto a photoresist layer by a light exposing apparatus, and a focus measuring region adapted to be imaged onto the photoresist layer by the light exposing apparatus when a focus value of the light exposing apparatus falls within a predetermined range.

A focus measuring method embodying the present invention comprises the steps of forming an image that includes a reference region on a photoresist film with the light exposing apparatus, wherein the image further comprises a focus measuring region when a focus value of the light exposing apparatus falls within a predetermined range, and determining the focus value of the light exposing apparatus by measuring a distance between a first point on the reference region and either a second point on the reference region or a point on the focus measuring region.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
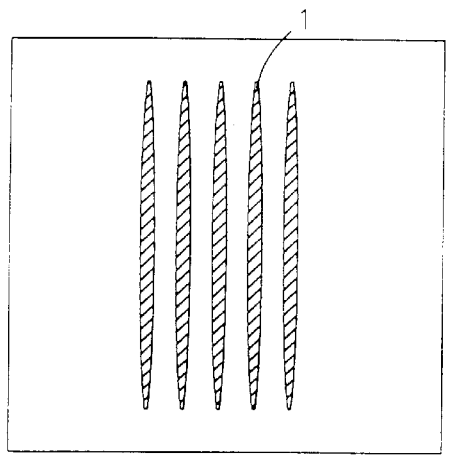
FIG. 1 illustrates a top view of a related art focus measuring pattern.
Figure 2:
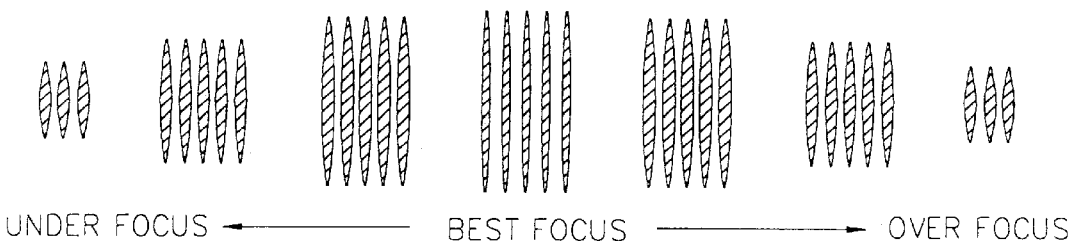
FIG. 2 illustrates a top view of a related art photoresist pattern obtained when a semiconductor substrate having a photoresist film on an upper surface is exposed using the related art focus measuring pattern of FIG. 1 as a mask while varying a focus value from a negative value to a positive value.
Figure 3:
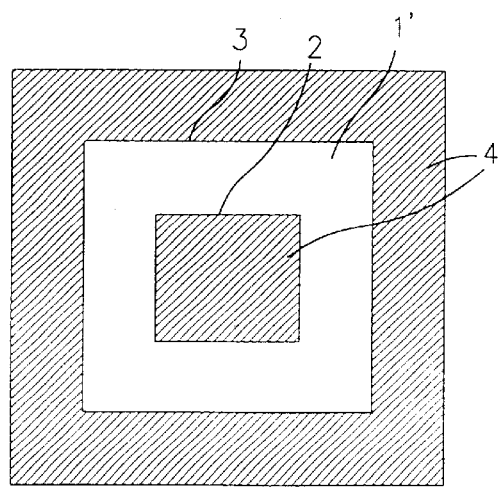
FIG. 3 illustrates a top view of an overlap measuring pattern according to the present invention.

A method for measuring a focus of a light exposing apparatus according to the present invention uses an overlap measuring apparatus. FIG. 3 illustrates a box-in-box type of pattern used for the overlap measuring apparatus. The unhatched region represents a hole 1' that is a light transmission region formed in a frame shape and located between a larger, outer frame 3 and a smaller, inner frame 2, both frames being rectangular in shape in the preferred embodiments. Patterns formed of the larger rectangular frame 3 and the smaller rectangular frame 2 are generally separately fabricated and then overlapped to form the related art overlap measuring pattern. However, in the present invention, the large rectangular frame 3 and smaller rectangular frame 2 are preferably formed together as one pattern and used as a mask for light-exposing the semiconductor substrate having a photoresist film formed thereon.

As a result of the light exposing operation in the photoresist film pattern of the semiconductor substrate, the hatched region 4 corresponds to a region in which the photoresist film remains, namely, an inner region of the smaller rectangular frame 2 and an outer region of the larger rectangular frame 3. The optimal focus of the light exposing apparatus is determined by the position at which the photoresist film pattern forms.

Figure 4:
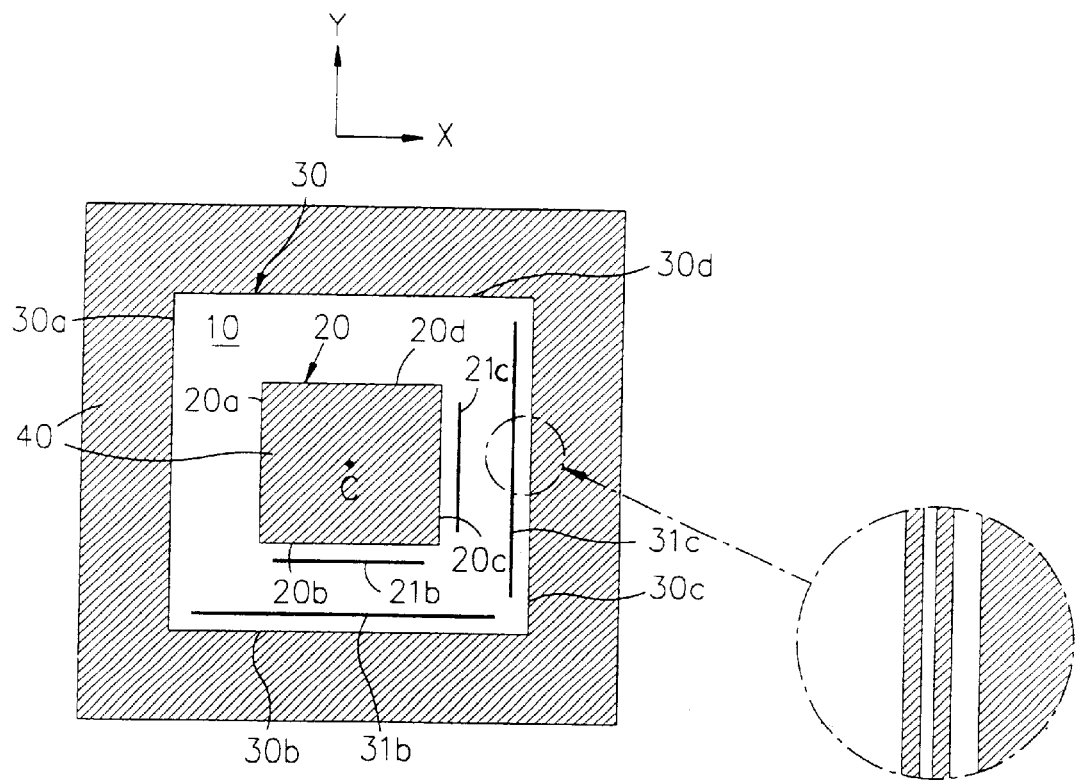
FIG. 4 illustrates a focus measuring pattern of a light exposing apparatus according to a first preferred embodiment of the present invention.

FIG. 4 illustrates a pattern for measuring a focus of a light exposing apparatus according to a first preferred embodiment of the present invention. The focus measuring pattern is based on the overlap measuring pattern illustrated in FIG. 3. In the first embodiment, a nonhatched region corresponds to a hole 10, and a hatched region 40 corresponds to a mask region where a photoresist film remains in the photoresist film pattern formed on the semiconductor substrate by light exposure, using the focus measuring pattern as a mask. The hole 10 is formed between a larger rectangular frame 30 and a smaller rectangular frame 20. Spaced-apart linear patterns 21b, 21c, 31b, 31c are formed in the hole 10, along the sides of the smaller and larger rectangular frames 20, 30.

FIG. 4 also illustrates an enlarged boundary portion of the hole 10. A boundary portion of the hole 10 includes a distance between one of the linear patterns (i.e., 31c) and a side of one the rectangles (i.e., 30c) A width of the boundary portion is about 1 to 3 times wider than a width of one of the linear patterns (i.e., 31c). In the present invention, the boundary portion is approximately 1 mm wide.

As shown therein, the linear patterns (i.e., 31c) are formed in two lines (i.e., columns), first linear patterns 21b, 21c are spaced along two of the smaller rectangular frame sides 20b, 20c, and second linear patterns 31b, 31c are spaced along two of the larger rectangular frame sides 30b, 30c. The smaller rectangular frame sides 20b, 20c and the larger rectangular frame sides 30b, 30c are proximally positioned such that the first and second linear patterns 21b, 21c and 31b, 31c, respectively, are spaced apart and run parallel.

The width of the linear pattern is determined based on a limit resolution. According to the present invention, it is possible to easily search for the optimal focus based on whether the linear pattern is formed on the photoresist film during the light-exposing process while varying the focus. To determine whether the photoresist film pattern has formed with an optimal focus, the width of the linear pattern is formed at the limit resolution based on the types of the light sources used by the light exposing apparatus. For example, when the light exposing apparatus uses an i-line having a wavelength of about 360 nm, the width of the linear pattern is below approximately 0.35 nm, and when the light exposing apparatus uses a DUV light source having a wavelength of about 248 nm, the width of the linear pattern is below approximately 0.25 nm.

Figure 5:
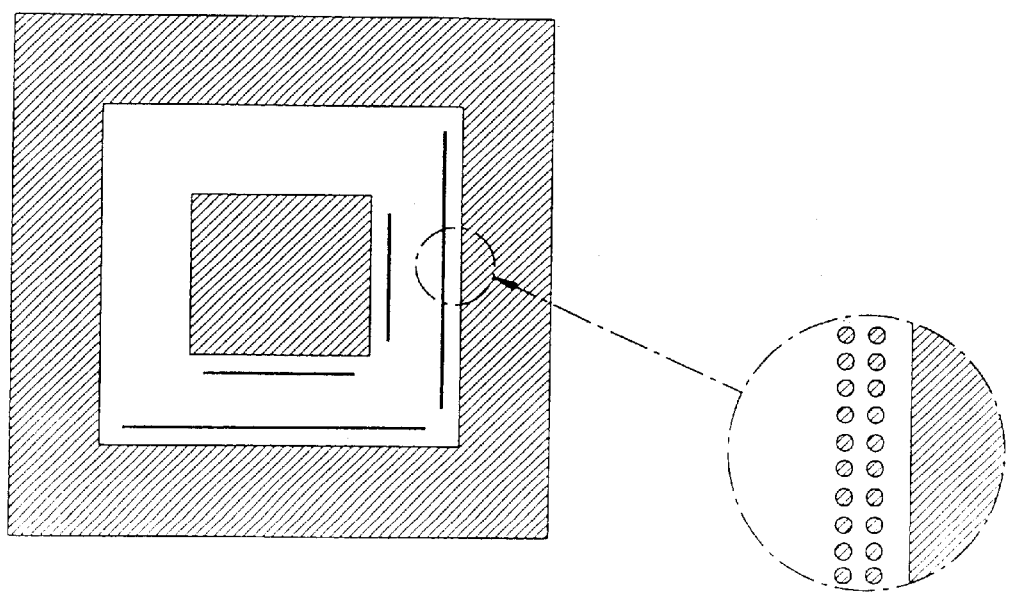
FIG. 5 illustrates a focus measuring pattern of a light exposing apparatus according to a second preferred embodiment of the present invention.

While FIG. 4 illustrates two lines on each adjacent side composing a linear pattern, the number of lines is not limited thereto. Preferably, the number of lines is at least 1, and the lines which form the linear pattern may be straight lines, as shown in FIG. 4, or a plurality of linearly arranged holes as in a second preferred embodiment of the present invention illustrated in FIG. 5. In the FIG. 5 embodiment, the linear patterns are formed of linearly arranged holes that are more sensitive to a variation of the focus than the linear patterns illustrated in FIG. 4.

Figure 6:
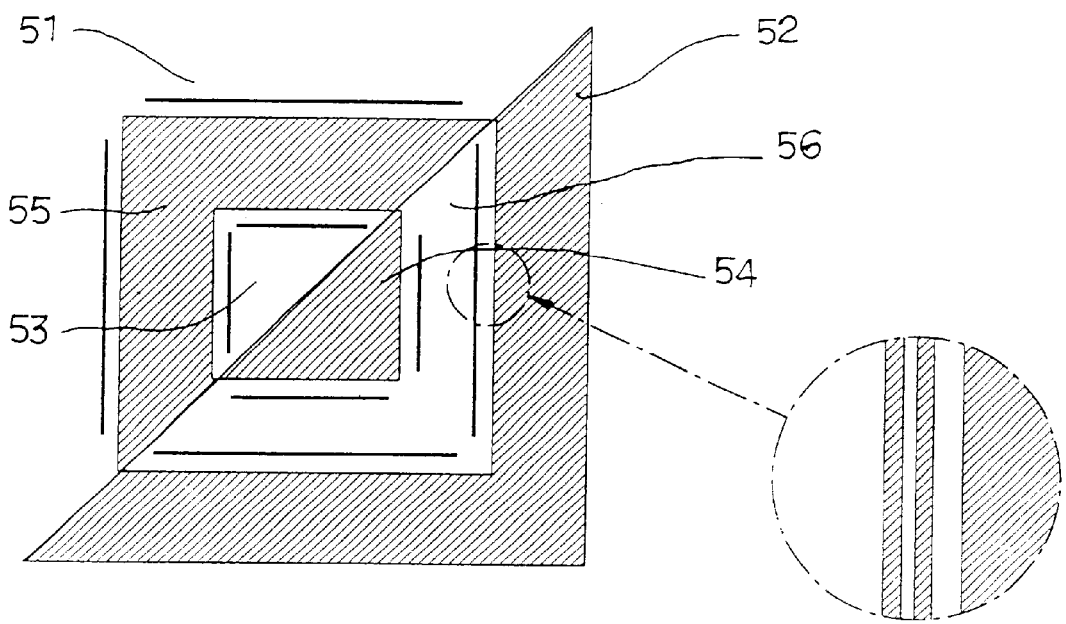
FIG. 6 illustrates a focus measuring pattern of a light exposing apparatus according to a third preferred embodiment of the present invention.

FIG. 6 illustrates a pattern for measuring a focus of a light exposing apparatus according to a third preferred embodiment of the present invention, based on the overlap measuring pattern illustrated in FIG. 3. As shown in FIG. 6, an outer frame having a first region 51 and a second region 52, an inner frame having a third region 53 and a fourth region 54, and an intermediate region positioned between the outer frame and the inner frame having a fifth region 55 and a sixth region 56, are formed. The first region 51, the third region 53, and the sixth region 56 form a light transmission region that permits light from the light exposing apparatus to be transmitted to the photoresist film. The second region 52, the fourth region 54 and the fifth region 55 form a mask region that blocks light transmission from the light exposing apparatus to the photoresist film. Accordingly, a linear pattern can be formed along all four sides of larger and smaller rectangular frames. The present embodiment illustrates six regions formed by diagonally dividing the outer frame into the first and second regions 51, 52, the intermediate region into the fifth and sixth regions 55, 56 and the inner smaller rectangular frames into the third and fourth regions 53, 54, wherein the sixth region 56 permits light transmission, and the fifth region 55 becomes a region which is not a hole and functions as a mark. The light transmitting region does not overlap with the mask region.

Figure 7:
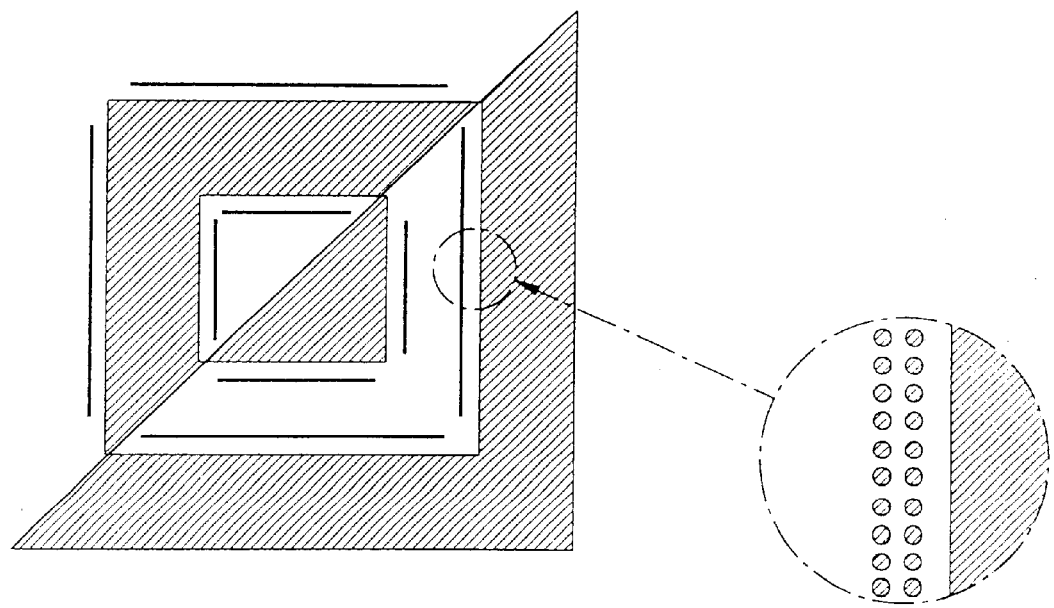
FIG. 7 illustrates a focus measuring pattern of a light exposing apparatus according to a fourth preferred embodiment of the present invention.

While the preferred embodiments illustrated in FIGS. 6 and 7 include a diagonally overlap measuring pattern, the present invention is not limited thereto. Namely, the frame shaped hole may be divided in any direction for any size. In addition, the linear patterns spaced apart by a certain distance are formed along four sides of two rectangular frames.

While FIG. 6 illustrates two pairs of lines (i.e., columns) formed on adjacent sides, the present invention is not limited thereto. For example, the number of the lines forming the linear pattern may be at least 1. Further, the lines which form the linear patterns may be formed of a straight line and/or linearly arranged holes.

FIG. 7 illustrates a pattern for measuring a focus of a light exposing apparatus according to a fourth preferred embodiment of the present invention. The embodiment of FIG. 7 is similar to the FIG. 6 embodiment, except that the linear patterns are composed of linearly arranged holes.

In the method for measuring a focus of a light exposing apparatus according to the present invention, the semiconductor substrate having a photoresist film formed thereon is light-exposed using the focus measuring pattern embodied in the present invention as a mask. As a result, a photoresist film pattern is formed on the upper surface of the semiconductor substrate. On the photoresist film pattern, a prescribed range which includes a boundary region of the hole and a linear pattern is defined. The overlap measuring apparatus measures whether the hole boundary region of the photoresist film pattern is in the prescribed range. The above-described range is formed within about 1 $\mu$m and is defined with respect to each of four sides of the smaller and larger rectangular frames 20, 30 illustrated in FIG. 4.

The optical focus of the photoresist film pattern depends on the spaced apart linear patterns along the hole boundary at the sides of the rectangular frames because the linear patterns are most clearly seen after the light exposing step when the optimal focus has been produced. The focus of the light exposing apparatus is less clear in the case of the underfocus or overfocus, and the focus can disappear completely. The width of the linear pattern formed on the photoresist film is determined in accordance with the focus of the light exposing apparatus.

The formation position of the photoresist film pattern is measured using the overlap measuring apparatus. At this time, the X-axis(horizontal axis) and the Y-axis(vertical axis) are designated, and the boundary position of the holes on the X-axis and the Y-axis are separately measured. The boundary position of the hole on the X-axis represents a position of the vertical sides of the two rectangular frames, and the boundary position of the hole on the Y-axis represents a position of the horizontal sides of the two rectangular frames.

Referring to FIG. 4, if the positional value at centers of two rectangular frames is 0, the boundary position of the smaller rectangular frame 20 is a negative value at 20a and a positive value at 20c or 21c on the X-axis, and an average of the negative and positive values is the X-value at the center point (C) of the smaller rectangular frame 20. Further, the boundary position of the smaller rectangular frame 20 is a negative value at 20b or 21b and a positive value at 20d on the Y-axis. In the same manner, when obtaining the center of the larger rectangular frame 30, the X-value at the center point (C) is an average of the negative value at 30a and a positive value at 30c or 31c, and the Y-value is an average of a negative value at 30b or 31b and a positive value at 30d.

If the focus is out of the permissible range, the linear pattern is not formed as a photoresist film pattern. Therefore, the center point differs in accordance with whether the linear pattern is formed as the photoresist film pattern.

For the center point of the smaller rectangular frame 20, when the focus is in the permissible range, the linear patterns are formed on the upper surface of the semiconductor substrate as a photoresist film pattern. Accordingly, the X-value at the center point is an average value of 20a and 21c, and the Y-value is an average value of 21b and 20d when the focus is in the permissible range. However, when the focus is not within the permissible range, the linear patterns are not formed as a photoresist film pattern, and the X-value at the center point is an average value of 20a and 20c, and the Y-value is an average value of 20b and 20d. Therefore, the center point moves left and upward when the focus is not with the permissible range, as compared to when the focus is in the permissible range.

For the center point of the larger rectangular frame 30, when the focus is in the permissible range, the X-value at the center point is an average value of 30a and 31c, and the Y-value is an average value of 31b and 30d. However, when the focus is out of the permissible range, the X-value at the center point is an average value of 30a and 30c, and the Y-value is an average value of 30b and 30d. Therefore, the center point moves right and downward when the focus is not within the permissible range, as compared to when the focus is in the permissible range.

As a result, the center points of the smaller and larger rectangular frames 20, 30 are more spaced-apart when the focus is outside the permissible range. Therefore, the relative movement of the center point of the rectangular frames 20, 30 increases as measured using the overlap measuring apparatus.

Figure 8A:
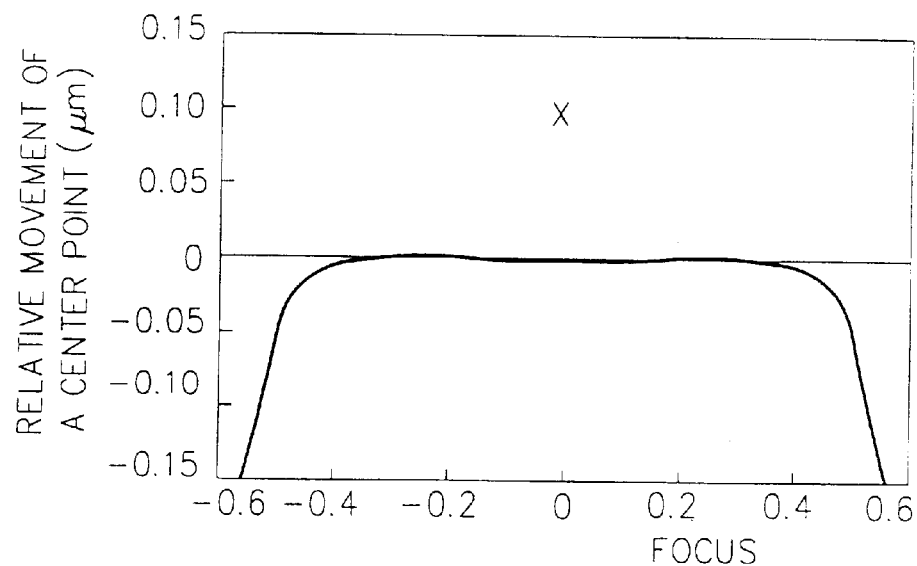
FIGS. 8A and 8B graphically illustrate a relative movement of a center point of two rectangles with respect to a X-axis and Y-axis according to the present invention.
Figure 8B:
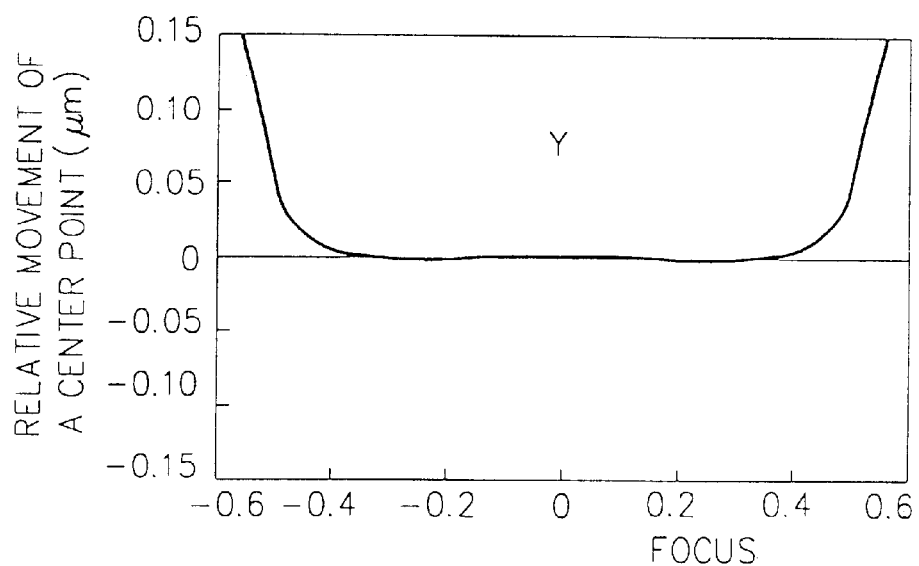

FIGS. 8A and 8B graphically illustrate a relative movement of the center points of the rectangular frames 20, 30 with respect to the X-axis and Y-axis measured using the overlap measuring apparatus embodied in the present invention. When varying between the underfocus of the negative value and the overfocus of the positive value, the relative movement of the center point is symmetrical. The optimal focus occurs at the center value of the symmetrical graph. Since the values of the foci on the X-axis and Y-axis equal 0, respectively, the related art zero point calibrating operation is not needed. For example, if a symmetrical value is obtained between the underfocus of −0.4 and the overfocus of +0.8, the center value of 0.2 is the optimal focus. If the permissible range of the optimal focus is 0.1, the optimal focus value of 0.2 obtained in the present example has a difference of 0.2 from the optimal focus value of 0. Thus, the optimal focus is out of the permissible range of 0.1. However, the present invention requires no additional adjustment, whereas in the related art, the value of 0.2 must be adjusted to 0 based on the related art zero point adjusting operation.

Once the focus of the light exposing apparatus has been measured using the overlap measuring apparatus according to the embodiments of the present invention in the above-described manner, the method for maintaining a uniform focus has been completed.

The embodiments of the present invention have various advantages. For example, it is possible to easily check the characteristics of a light exposing apparatus related to the focus control using a focus measuring pattern embodied in the present invention. Field curvature and astigmatism are important characteristics of the light exposing apparatus related to the focus control. To measure field curvature and astigmatism, the focus must be measured at 150 points on one wafer. Since the focus in the present invention is automatically measured using a focus measuring pattern of the light exposing apparatus, the field curvature and the astigmatism can be quickly and easily measured. While checking a field curvature or astigmatism requires about one day in the related art, the present invention requires only about 5 minutes, thus significantly decreasing the measuring time.

Additionally, in the focus measuring method according to the present invention, since the focus measuring operation is automatically performed, it is possible to significantly enhance reliability and reproducibility compared to the related art which uses human eyes and a microscope. While checking the photoresist film pattern at a plurality of points of one wafer by human eyes using a microscope requires about one hour, the focus measuring method according to the present invention that uses an overlap measuring apparatus requires only about 1 to 2 minutes. Therefore, the present invention can significantly decrease the focus measuring time.

As noted above, the related art step of calibrating the optimal focus to a value of 0 after microscope inspection is not required. Thus, additional time and cost savings are achieved in the embodiments of the present invention by not requiting the related art zero point adjusting operation.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An overlap measuring pattern for forming a photoresist pattern on a substrate, comprising:
   an outer frame;
   an inner frame positioned within the outer frame, wherein the inner frame and the outer frame have a rectangular shape and form a mask region that blocks the transmission of light from a light exposing apparatus;
   a light transmission region, positioned between the inner frame and the outer frame, that allows a transmission of light from the light exposing apparatus; and
   a focus measuring pattern positioned in the light transmission region, wherein said focus measuring pattern is imaged by the light exposing apparatus onto the photoresist pattern only when a focus value of the light exposing apparatus falls within a predetermined range.

2. The pattern of claim 1, wherein the focus measuring pattern comprises at least one linear pattern spaced apart from the inner frame and the outer frame in the light transmission region, and positioned at a predetermined distance from and parallel to a boundary of the inner frame and a boundary of the outer frame.

3. The pattern of claim 2, wherein a distance between the inner frame boundary and the outer frame boundary and the at least one linear pattern is 1 to 3 times greater than a width of the at least one linear pattern.

4. The pattern of claim 2, wherein said at least one linear pattern is positioned parallel to and along an outer side of the inner frame and along an adjacent inner side of the outer frame.

5. The pattern of claim 2, wherein said at least one linear pattern comprises linear patterns positioned parallel to and along horizontal and vertical sides of the inner frame, and positioned adjacent to horizontal and vertical sides of the outer frame.

6. The pattern of claim 2, wherein said at least one linear pattern is one of a straight line and a plurality of linear holes.

7. The pattern of claim 6, wherein a width of the straight line and a diameter of the linear holes are proportional to a prescribed limit resolution, determined in accordance with a light source used for the light exposing apparatus.

8. An overlap measuring pattern for forming a photoresist pattern on a substrate, comprising:
   an outer rectangular-shaped frame having a first region and a second region;
   an inner rectangular-shaped frame having a third region and a fourth region;
   an intermediate region positioned between the outer frame and the inner frame, having a fifth region and a sixth region, wherein the first region, the third region and the sixth region form a light transmission region that allows a light transmission from a light exposing apparatus, and the second region, the fourth region and the fifth region form a mask region that blocks light transmission from the light exposing apparatus; and
   a focus measuring pattern positioned in the light transmission region, wherein said focus measuring pattern is only imaged by the light exposing apparatus onto the photoresist pattern when a focus value of the light exposing apparatus falls within a predetermined range.

9. The pattern of claim 8, wherein the focus measuring pattern comprises at least one linear pattern spaced apart from the mask region and positioned in the light transmission region at a predetermined distance from and parallel to a boundary of one of the inner frame, the outer frame, and the intermediate region.

10. The pattern of claim 9, wherein a distance between said boundary and the at least one linear pattern is 1 to 3 times greater than a width of the at least one linear pattern.

11. The pattern of claim 9, wherein said at least one linear pattern is spaced-apart by a predetermined distance from a boundary of the mask region.

12. The pattern of claim 9, wherein said at least one linear pattern is one of a straight line and a plurality of linear holes.

13. The pattern of claim 12, wherein a width of the straight line and a diameter of the linear holes are proportional to a limit resolution, determined in accordance with a light source used for the light exposing apparatus.

14. A focus measuring method for a light exposing apparatus, comprising the steps of:
   forming an image that includes a reference region on a photoresist film with the light exposing apparatus, wherein the image further comprises a focus measuring region only when a focus value of the light exposing apparatus falls within a predetermined range; and determining the focus value of the light exposing apparatus by measuring a distance between a first point on the reference region and either a second point on the reference region or a point on the focus measuring region.

15. The method of claim 14, further comprising the step of varying the focus value of the light exposing apparatus until the focus measuring region forms.

16. The method of claim 14, wherein the reference region comprises an inner frame, an outer frame, and an intermediate frame such that first regions of said frames block transmission of light and second regions of said frames permit transmission of light.

17. The method of claim 16, wherein the first regions do not overlap with the second regions.

18. The method of claim 14, wherein the focus measuring region is one of a straight line and a pattern of holes.

19. The method of claim 18, wherein the determining step comprises measuring a distance between the first point and a point on one of the straight line and the pattern of holes.

20. An overlap measuring pattern for forming a photoresist pattern on a substrate, comprising:
- a reference region adapted to be imaged onto a photoresist layer by a light exposing apparatus; and
- a focus measuring region adapted to be imaged onto the photoresist layer by the light exposing apparatus only when a focus value of the light exposing apparatus falls within a predetermined range.

* * * * *